(12) United States Patent
Honda et al.

(10) Patent No.: US 12,038,802 B2
(45) Date of Patent: Jul. 16, 2024

(54) COLLABORATIVE LEARNING MODEL FOR SEMICONDUCTOR APPLICATIONS

(71) Applicant: PDF Solutions, Inc., Santa Clara, CA (US)

(72) Inventors: Tomonori Honda, Santa Clara, CA (US); Richard Burch, McKinney, TX (US); John Kibarian, Los Altos Hills, CA (US); Lin Lee Cheong, San Jose, CA (US); Qing Zhu, Rowlett, TX (US); Vaishnavi Reddipalli, San Jose, CA (US); Kenneth Harris, Kaneohe, HI (US); Said Akar, Miami, FL (US); Jeffrey D David, San Jose, CA (US); Michael Keleher, Kirkland, WA (US); Brian Stine, Palo Alto, CA (US); Dennis Ciplickas, San Jose, CA (US)

(73) Assignee: PDF Solutions, Inc., Santa Clara, CA (US)

( * ) Notice: Subject to any disclaimer, the term of this patent is extended or adjusted under 35 U.S.C. 154(b) by 848 days.

(21) Appl. No.: 17/070,520

(22) Filed: Oct. 14, 2020

(65) Prior Publication Data

US 2021/0142122 A1 May 13, 2021

Related U.S. Application Data

(60) Provisional application No. 62/914,901, filed on Oct. 14, 2019.

(51) Int. Cl.
*G06N 20/00* (2019.01)
*G06F 11/07* (2006.01)
(Continued)

(52) U.S. Cl.
CPC ........ *G06F 11/079* (2013.01); *G06F 11/0736* (2013.01); *G06F 11/0751* (2013.01);
(Continued)

(58) Field of Classification Search
CPC ............... G06F 11/079; G06F 11/0736; G06F 11/0751; G06F 11/0778; G06F 18/211;
(Continued)

(56) References Cited

U.S. PATENT DOCUMENTS

| 7,987,150 B1* | 7/2011 | Luu ........................ G06N 20/00 706/47 |
| 2004/0156540 A1 | 8/2004 | Gao et al. |

(Continued)

OTHER PUBLICATIONS

Wu, Ming-Ju, Jyh-Shing R. Jang, and Jui-Long Chen. "Wafer map failure pattern recognition and similarity ranking for large-scale data sets." IEEE Transactions on Semiconductor Manufacturing 28.1 (2014): 1-12 (Year: 2014).*

(Continued)

*Primary Examiner* — Andrew T McIntosh
(74) *Attorney, Agent, or Firm* — Dergosits & Noah LLP

(57) ABSTRACT

Classifying wafers using Collaborative Learning. An initial wafer classification is determined by a rule-based model. A predicted wafer classification is determined by a machine learning model. Multiple users can manually review the classifications to confirm or modify, or to add user classifications. All of the classifications are input to the machine learning model to continuously update its scheme for detection and classification.

13 Claims, 4 Drawing Sheets

(51) Int. Cl.
  *G06F 18/211* (2023.01)
  *G06F 18/241* (2023.01)
  *G06F 18/40* (2023.01)
  *H01L 21/02* (2006.01)
  *G06F 3/0482* (2013.01)
  *G06N 3/08* (2023.01)
  *G06N 7/01* (2023.01)

(52) U.S. Cl.
  CPC ........ *G06F 11/0778* (2013.01); *G06F 18/211* (2023.01); *G06F 18/241* (2023.01); *G06F 18/40* (2023.01); *G06N 20/00* (2019.01); *H01L 21/02* (2013.01); *G06F 3/0482* (2013.01); *G06N 3/08* (2013.01); *G06N 7/01* (2023.01)

(58) Field of Classification Search
  CPC ...... G06F 18/241; G06F 18/40; G06F 3/0482; G06N 20/00; G06N 3/08; G06N 7/01; H01L 21/02
  See application file for complete search history.

(56) References Cited

U.S. PATENT DOCUMENTS

| | | | | |
|---|---|---|---|---|
| 2006/0078188 | A1* | 4/2006 | Kurihara | G06T 7/0004 |
| | | | | 382/149 |
| 2006/0082763 | A1* | 4/2006 | Teh | G01N 21/9501 |
| | | | | 356/237.2 |
| 2010/0138026 | A1* | 6/2010 | Kaushal | G06N 5/04 |
| | | | | 706/23 |
| 2013/0045545 | A1 | 2/2013 | Lee | |
| 2013/0170738 | A1 | 7/2013 | Capuozzo et al. | |
| 2013/0173041 | A1* | 7/2013 | Leu | G06Q 10/06395 |
| | | | | 700/105 |
| 2013/0173332 | A1* | 7/2013 | Ho | G06Q 10/06 |
| | | | | 705/7.27 |
| 2014/0106474 | A1 | 4/2014 | Chen et al. | |
| 2015/0125064 | A1 | 5/2015 | Chen et al. | |
| 2017/0082555 | A1* | 3/2017 | He | G06N 20/20 |
| 2017/0200260 | A1* | 7/2017 | Bhaskar | G06F 18/2413 |
| 2020/0241788 | A1* | 7/2020 | Narayanam | G06F 3/0647 |

OTHER PUBLICATIONS

Chao, Li-Chang, and Lee-Ing Tong. "Wafer defect pattern recognition by multi-class support vector machines by using a novel defect cluster index." Expert Systems with Applications 36.6 (2009): 10158-10167 (Year: 2009).*

Ooi, Melanie Po-Leen, et al. "Defect cluster recognition system for fabricated semiconductor wafers." Engineering Applications of Artificial Intelligence 26.3 (2013): 1029-1043 (Year: 2013).*

International Search Report and Outgoing Written Opinion of the ISA, dated Jan. 27, 2021.

Baly, et al. "Wafer Classification Using Support Vector Machines", IEEE Transactions on Semiconductor Manufacturing. Apr. 26, 2012 (Apr. 26, 2012) Retrieved on Dec. 24, 2020 (Dec. 24, 2020) from <URL: https://ieeexplore.ieee.org/document/6189084>.

* cited by examiner

COLLABORATIVE LEARNING MODEL FOR SEMICONDUCTOR APPLICATIONS

CROSS REFERENCE

This application claims priority from U.S. Provisional Application No. 62/914901 entitled Collaborative Learning for Semiconductor Applications, filed Oct. 14, 2019, incorporated herein by reference in its entirety.

TECHNICAL FIELD

This application relates to classification of wafers during semiconductor manufacturing, and more particularly, to a scheme for collaborative learning to improve the classification process.

BACKGROUND

A typical process for fabricating semiconductor wafers has hundreds or even thousands of steps over a period of months before the wafers are transformed into the final integrated circuit products produced by the process and ready to be packaged and shipped to customers. Classification of wafers post-fabrication is important for evaluating wafer fabrication yield performance.

In one current scheme, customers utilize a variety of computer-generated outputs to determine wafer quality. For example, a graphical user interface (GUI) may be supported by a data template, such as the Exensio® analytics platform for semiconductor foundries marketed by PDF Solutions, Inc. The template is configured such that the GUI is generated to contain and display for user review wafer information including results of wafer inspections. A typical wafer information display will include at least wafer identifying information, wafer classification information, and wafer map images.

A large number of rules (e.g., 200+) are typically created in an instance of the template for processing and presenting wafer information for the customer to review for one or more lots of wafers currently in a step of the fabrication process. In particular, the recognition of clusters in the wafer maps is the primary objective of many rules. In one example, if there are any clusters that are not caught by the 200+ rules and it is deemed necessary, an additional rule is created to capture the new cluster signature and a new rule added to the existing set of rules for prediction on future wafers. In addition, upon review of rules-based results and clustering information, the customer can modify wafer quality labels.

In general, wafer classification can depend on a variety of methods as inputs. As an example, classification of baseline states, or excursions, or known spatial issues, or other typical classification states, can be deterministic based on various calculated rules and statistics, such as: (i) Automatic Signature Classification (ASC): wafers are classified based on zonal bin yield patterns, according to multiple zone definitions and composite bin calculations; (ii) Clustering: wafers are classified based on clusters of die bin values; (iii) Frequency Selective Surfaces (FSS): pre-existing and/or user-defined rules are used for identifying patterns; (iv) Yield Information: statistical measures of current wafer yield, such as Statistical Bin Limit (SBL) and Statistical Yield Limit (SYL).

The final wafer classification (or "consolidated classification" or "consolidated label") can be in the form of an output string encapsulating relevant information from the calculated classifications. However, the determination of wafer classification using prior methods is not always adequate as customers must manually review and sometimes correct or update wafer classifications. This usually requires that the customer manually tune the rules and parameters over several iterations for each of the chip lines separately. It would be desirable to utilize the manual review in combination with machine-based schemes to improve the accuracy of wafer classification.

DETAILED DESCRIPTION

Collaborative Learning (CL) describes an implementation within the field of Active Learning (AL), which is within the more general field of Machine Learning (ML). For example, AL is used by Internet websites to incorporate input from users (thumbs up, thumbs down) to decide on product offerings or related marketing. This approach can be adopted to semiconductor manufacturing and post-manufacturing for enhancing the current analytics-based approaches by correcting misclassifications of die or wafer failure modes.

Figure 1:
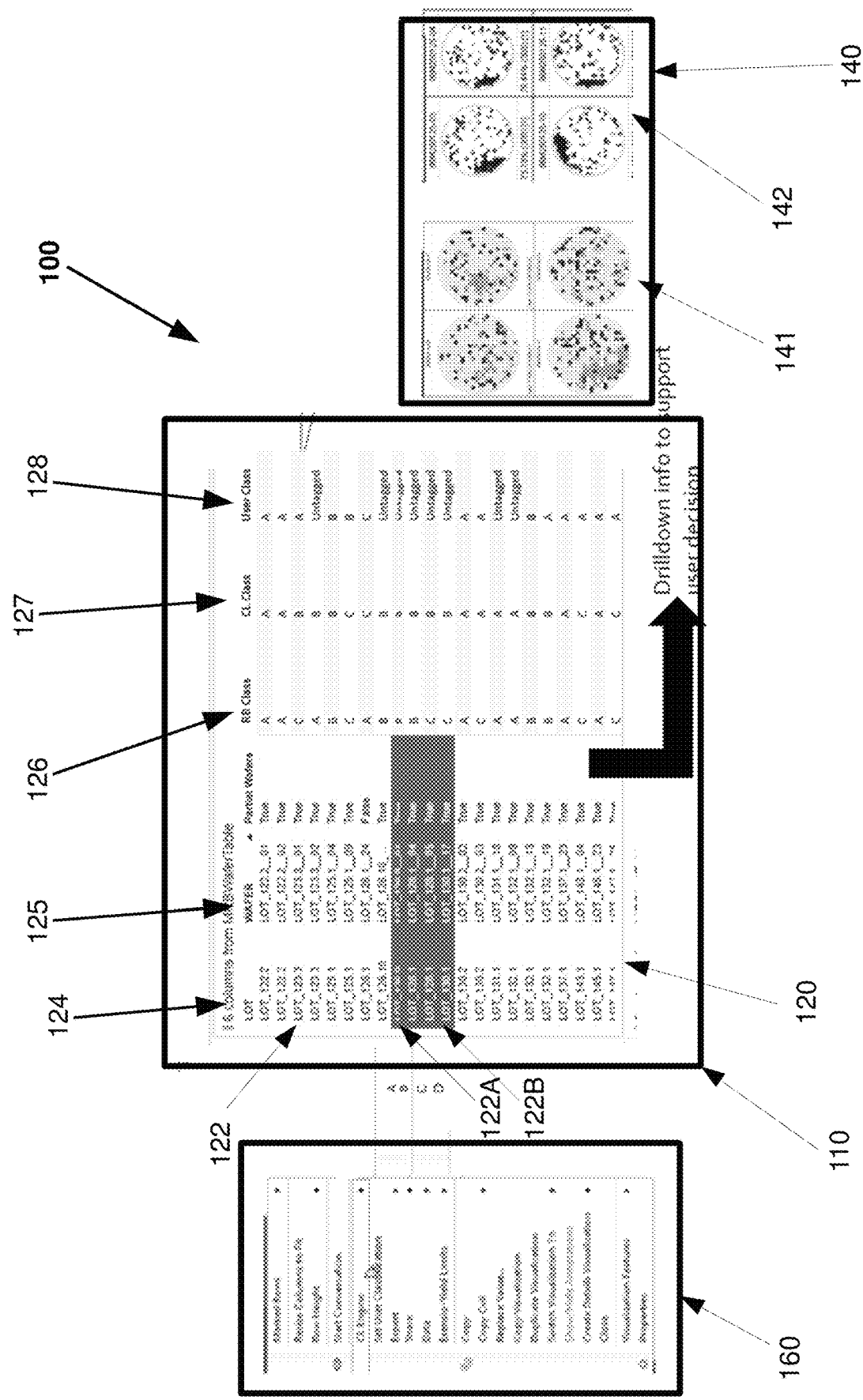
FIG. 1 is an illustration of a simplified graphical user interface (GUI).

FIG. 1 is one embodiment of a simplified graphical user interface (GUI) 100, presented for illustration purposes only, that may be used to implement a collaborative learning environment for classifying wafers. The GUI 100 is a processor-based tool that provides a visual display of information in a formatted manner, with widgets of various design for enabling user interaction with at least the displayed information, and for providing control functions, all as generally known.

The processor could be desktop-based, i.e., standalone, or part of a networked system; but given the heavy loads of information to be processed and interactively displayed, processor capabilities (CPU, RAM, etc.) should be current state-of-the-art to maximize effectiveness. In the semiconductor foundry environment, the Exensio® analytics platform is a useful choice for building GUI templates. In one embodiment, coding of the underlying processing routines may be done using Spotfire® analytics software version 7.11 or above, which is compatible with Python object-oriented programming language, used primarily for coding machine language models described below.

In the example of FIG. 1, GUI 100 includes two main windows or panels: a first window 110 for wafer information, and a second window 140 for wafer maps, such as maps 141, 142.

In the first window 110, a template or spreadsheet 120 is presented that includes multiple rows 122 each displaying classification information for wafers in process. The columns provide the identity of the wafers being reviewed, as well as the relevant classification data. Thus, column 124 identifies the wafer lot while column 125 identifies the specific wafer; column 126 identifies the current classification for the wafer in that row as determined by a first rule-based (RB) model, typically through heuristic and deterministic methods; column 127 identifies the classification as determined by a collaborative learning (CL) model, and column 128 identifies a user-entered modification to the final classification, if any.

In a second window 140, one or more wafer maps such as maps 141, 142 are displayed for a row that has been selected. For example, rows 122A and 122B are highlighted to indicate they have been selected, and therefore a set of corresponding wafer maps 141A and 142A for the wafer identified in rows 122A and 122B, respectively, are concurrently displayed in the second window 140.

One or more sets of user controls 160 are provided in conventional manner as necessary to navigate around the display, select one or more items for review, or modification, or digging deeper into underlying data, etc. For example, panel 160 is implemented as a pop-up window in this example, with selectable sub-menu choices, enabled when one or more wafer rows is selected for review. Buttons, menus, and other widgets can be enabled in well-known manner to provide functionality for user controls and user interactions, as discussed in more detail below.

Of course, the GUI could be formatted in many different ways, and with more informational items presented or quickly accessible via the main GUI or a sub-menu. For example, the template 120 in FIG. 1 can be presented in the primary interface as a detailed spreadsheet with more columns of wafer information considered to be key variables for a particular customer, and links to wafer maps and/or other wafer-related information.

The problem statement is straightforward—a model needs to classify the wafers, but also should provide a confidence level for the classification, even if the classification is "unknown" or "uncertain." As a conceptual example of collaborative learning applied to wafer classification, wafer classification can be determined by multiple methods, possibly resulting in different classifications for the same wafer issues. However, the disagreements between methods can be resolved by analytic review, including rules-based analytics, machine learning predictions, and manual review by human user(s). The model for making such determinations is continuously updated with learnings from the review of classification differences and updating the various detection and classification schemes as necessary in accord with the leanings.

Figure 2:
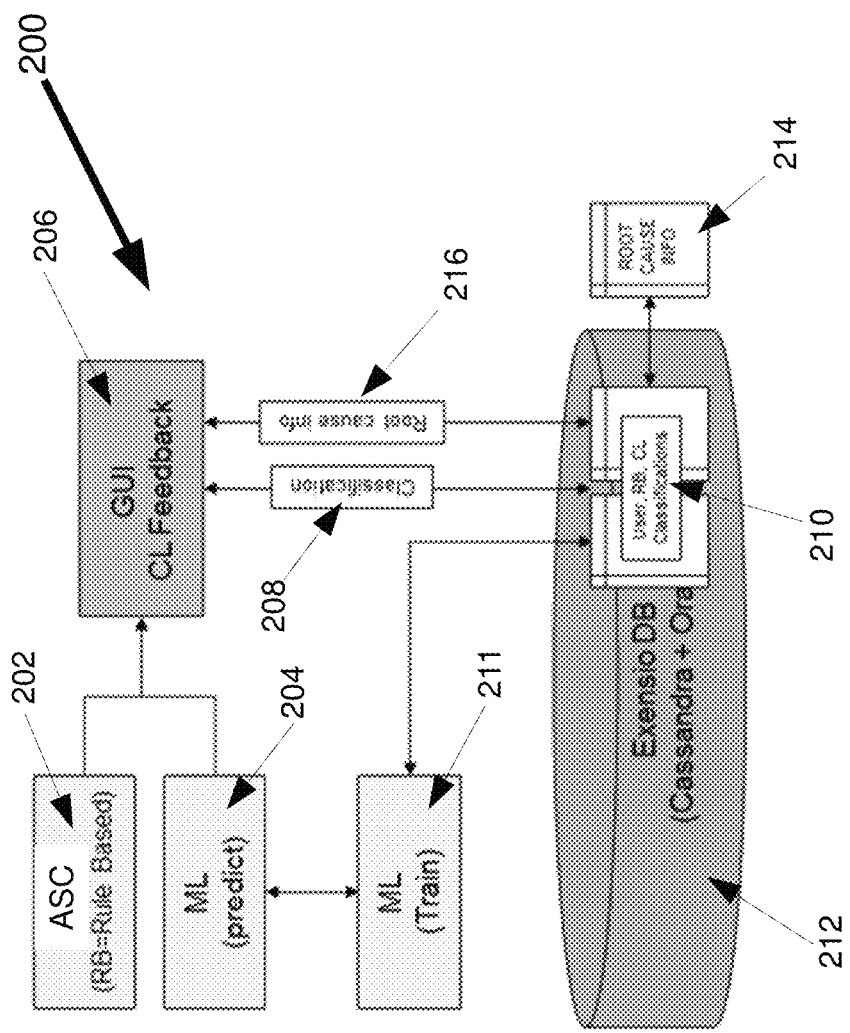
FIG. 2 is a block diagram illustrating one embodiment of a Collaborative Learning (CL) model for wafer classification.

FIG. 2 is a simplified block diagram of one example of a collaborative learning model 200 for wafer classification. In a first module 202, the initial classifications are made by one or more rule-based (RB) models, for example, using ASC and/or other deterministic methods as previously described. Such methods are known to provide correct classification for a large majority of wafers (~95%). The results from these one or more RB models can provided to the GUI 206 for display and/or selection, as illustrated by column 126 of FIG. 1.

One or more Machine Learning (ML) models are used in module 204 to predict classifications, for example, based on the initial classifications from module 202, the schedule, features of interest, etc., as well as user feedback as described below. The results from the ML models can be provided directly to the GUI 206 for individual display and/or selection. However, in one embodiment, the ML models incorporate inputs including user feedback to create a classification based on the "collaboration" of different classification inputs—from the RB model analysis, from the ML model prediction, and from multiple user feedback/correction—and thus the Collaborative Learning (CL) model determines a classification, as in column 127 of FIG. 1.

As indicated, the results from the RB model 202 and the ML model 204 can displayed in GUI 206 for user review, and the user can select one or more wafers or lots to review and consider, and perhaps dive deeper into the data to try and better understand any unexplained anomalies or excursions before settling on a final classification. The user can provide feedback to either confirm the classifications, or to enter a different classification, as in column 128 of FIG. 2. Note that user is not restricted to the classification provided by the RB model. For example, the user could create a new class that combines multiple RB classes together or divides a single RB class into multiple RB classes. The GUI 206 can also provide the user the ability to add comments, e.g., to explain an update to a wafer classification. All the classifications (rule-based, ML predictions, and user reclassifications) and related wafer information are saved into storage 210 accessible to or part of database 212.

The stored classification information may be retrieved by the user in the GUI 206, for example, to use for comparison purposes in a manual review of classification determinations. The classification information stored via database 212 is also used to train an ML model in module 211 such that the ML prediction model in module 204 is updated periodically.

Human interaction with the RB models and ML models in an active learning mode allows the user to continually improve and validate the classifications, building user confidence in the system. Further, as the dataset grows and more user reclassification is provided, the collaborative learning environment described here will continue to improve the classification scheme. For example, existing rules may be modified or new rules added in the RB portion of the environment; and the ML models, in both training and prediction, will continue to refine their algorithms based on inputs received, as even different opinions by different human reviewers can be evaluated given enough instances of reviewer modifications.

The combination of classification and active learning can be either binary or multi-class. For example, the desired output is typically categorical labels. In one use case, this can be simply implemented as a single column with output strings in the relevant clustering template. Initial labeling is typically based on the output from deterministic rules, as described above. Some common labels may include bin, detail pattern, etc., although the customer dataset may and usually does dictate what desirable outputs can be predicted using the input dataset.

The input dataset can consist of ASC data (which is typically very large) or other zonal based summaries, clustering, FSS and yield per wafer, and possibly die-bin data (which is even larger). However, if the ASC data is used in the prediction, then at least initially, it should be recalculated on the fly from the raw die-bin data during model training. The final dataset can be determined based on model review and evaluation.

The following are reasonable assumptions to be made in creating a CL model: (1) there is sufficient data to train the model without user feedback, i.e., there are more sensor observations/test measurements for most of die within the wafer than features; (2) there exists enough representative samples for each of the classes; for example, the classical rule of thumb is that, as a minimum, there should be greater than 30-50 observations per class or root cause; but that does not always hold true. If there are insufficient observations available for classification, and upsampling/downsampling is inadequate to compensate, then "unknown" is returned as the classification (which means that the wafer is abnormal, but it cannot classify into known categories); (3) there are sufficient amounts of relabeled data; (4) there is good consistency between human labelers (a known issue in active learning); (5) the training data is a good representation of wafers for prediction; (6) the required cases, i.e., the target features, are covered in training set; (7) the output is categorical data; and (8) the input features are stable, i.e., no missing or new features.

Figure 3:
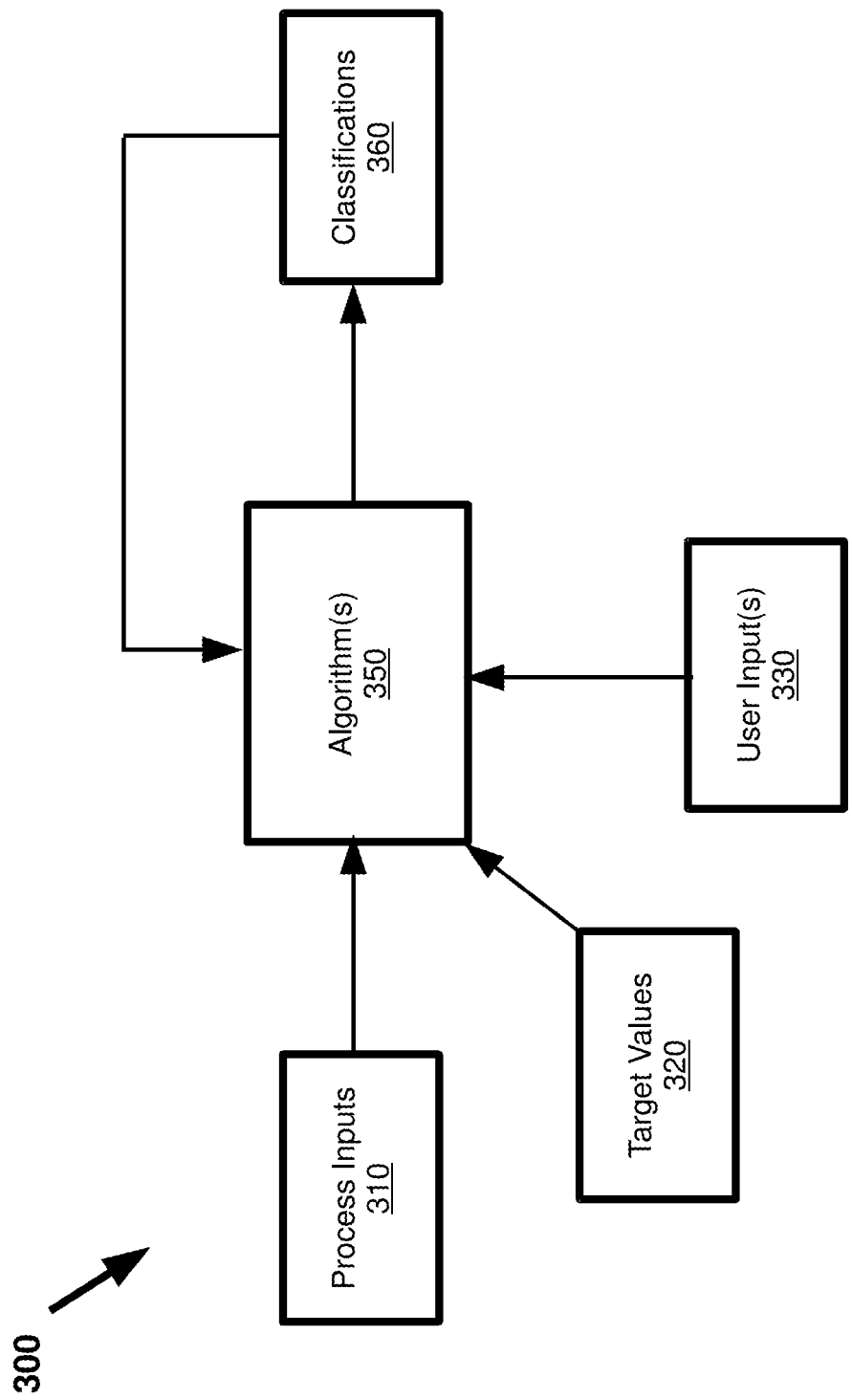
FIG. 3 is a block diagram illustrating a conceptual overview of a CL model for wafer classification.

A simple conceptual overview of a collaborative learning environment for wafer classification is shown in FIG. 3. For example, typical process inputs 310 can include: (1) the BinMap, namely the wafer (x, y) coordinate of the chip and the Bin for the chip. As one example, the BinMap can be transformed using convolution in a Convolution Neural Network; (2) a zonal summary, namely, for each zone (center, outer, top right, etc.), compute the count of wafers for each Bin that have been transformed using z-transformation; and (3) other typical transformations, such Wavelet, 2D FFT, transformed on the 2D Wafer BinMap.

Target values 320 for features of interest will of course be different for different devices and processes and will ultimately rely heavily on the aggregation of data from the RB model and user input to determine and update the correct set of classification labels. User input 330, including confirmations, updates, and comments, allows the classification model to learn and grow. Whenever there is conflicting input from multiple users, the system will try to resolve the conflict by considering the timing of the inputs and other possible information, such as user group (manager, subject matter expert, etc.).

The algorithmic element 350 can be defined by any typical classifier with or without hyper-parameter tuning including, for example, K-Nearest neighbors, Robust Logic Regression with regularization, Naïve Bayes, Multilayer Perception and other Neural Networks, Linear & Nonlinear SVM, an ensemble of Decision Trees, such as ExtraTrees, Random Forest, Gradient Boosting Machine, xgboost, etc. These classifiers can be used collectively depending on computational and accuracy requirements. Alternatively, the best performing algorithm could be selected based on metrics like accuracy, F1 score, AUC, Precision-Recall AUC, etc.

The result 360 is a continuously learning and updating classification scheme. As already described, a GUI can be generated to implement a collaborative learning platform for wafer classification and should include functionality for a broad set of objectives.

The first set of functional aspects to be implemented in the GUI are related to review of the template and the workflow. As noted above, the template can be a user-interactive standalone template or network-based with adequate system and data protections. Users may be allowed to specify the scope of data to review in a data retrieval window.

The user should be provided with the potential to review the following: original rules based results, including but not limited to: zone cluster, zone pattern classification, System Yield Bin statistical limits, consolidation rules; MRB template; wafer maps; wafer information, such as wafer ID, lot ID; and MRB-based (rules based) predictions.

Model-based prediction decisioning and model-based confidence scoring should also be available to review; but if the model crashes or other errors occur during processing, an error message should be displayed.

Final wafer classification can be determined from the consolidated labeling review. One option is to set as default state the model-based predictions (once established). If the user has already reviewed the wafer classifications, then the result of the review will be set as the default state for final wafer classification.

The user must be given the ability to provide feedback through the classification GUI. For example, the user may be able to simply toggle the final wafer-based and consolidated label, such as through a drop-down list. A typical set of available options for a drop-down list includes selecting string labels output from MRB. The user may be constrained to selecting labels from an existing list rather than creating custom labels, but the existing list should include a selectable option such as "unknown" or similar. For some cases, user is allowed to provide new labels as well. In this case, the GUI may provide similar classes to reduce chance of creating redundant classes. The user should also have the ability to add comments, for example, a comment section could include text explaining the user change.

The model should be provided with the ability to record changes but also to connect those changes to specific users, for example, through a timestamp, a username, a unique key, etc. The model should also be able to create a subset of the data that is being pulled into template, primarily based on time. It may be desirable to restrict data to data available within the template and/or a similar data type that can be queried from the database.

The user should have the ability to extract input data from previous templates or steps in workflow, such as ASC data or other. An intermediate solution, if necessary, would be to extract the input data via a programmed portal, e.g., using Python or R coding. This step can serve as a reality check for consistency with prior classification decisions, for example.

The model should have the ability to display summary model information, such as: (i) model name; (ii) date/time of model creation; (iii) model location/link; (iv) errors, if model is unable make a prediction (due to missing features, etc.); (v) product-specific information; and (vi) training performance and statistics.

The user should have the ability to call the model prediction routine and/or the model training routine as part of template or workflow. For example, a simple button or widget called "run manual prediction" or similar could be configured within the GUI and/or controls can be provided to run predictions at user-defined intervals.

The next set of functional aspects to be implemented in the GUI are related to training and prediction capabilities. In one embodiment, this functionality can be provided in a separate panel or window. For example, the user should be able to create a classification model upon request. This refers to the basic model instance, configured using Python or R coding, for example, that results from model training. The user should then also have the ability to call the method prediction from the model object.

A model object can be output, including all the preprocessing information required to transform features appropriate to the model object, and the classification model itself, for predictions for new wafers. The model can be written to disk, and to a server library. As an alternative, a path string can be returned to the template or workflow to use for future predictions. A default is that the template will initially save and display predictions a default location or a user-specified location. A permissions scheme may be implemented to write out model objects to disk, for example, as well as to return updated classification labels and tables to the database and the GUI.

An output file can be generated in a CSV format suitable for spreadsheets, and may include additional columns, such as model prediction, and finalized labels with user input/ relabeling. The database will have the ability to save models, predictions, user modifications, etc., for easy retrieval by the user from the GUI template.

A typical process may result in, for example, 5000 models built, but only a small number, perhaps 10-20, of the models will truly be key to classification scheme improvement.

If individual bin information is needed, then even for small chips this can translate to fairly heavy information loads via Spotfire. For example, if single wafer has ~1000 chips, then a 1000-wafer data set (which is reasonable for an in-production process) would result in $10^6$ observations. If individual bins are not used, then the resulting data can be considerably smaller, with some of the remaining inputs on a per wafer basis.

Other features can be contemplated, depending entirely upon customer needs, and such features integrated into a template instance. For example, the collaborative classification method could be automated into the process workflow. For displayed results, wafers have the least model confidence can be displayed towards the top to ensure user review. Drilldown capability could be implemented for each wafer, for example, to review WEH, metrology, defect, indicator, PCM, etc.

In particular, root-cause analysis can and should be an important part of classification review and updating. For example, in FIG. 2, known root-cause information can be stored in root-cause storage 214 and also associated or linked with specific excursions or defects in the database 212. The root-cause information can also be made available to the user in GUI 206 as part of the user's manual classification review, for example, as drill-down information, and likewise, the user feedback can be provided and incorporate into root-cause learning as well.

With regard to specification of the interface, in general, the collaborative learning template can pull data from two sources: (i) the database, having been updated by previous workflows, including adjusted labels through training and updating the ML model; and (ii) a text file, containing results that were previously relabeled.

The relabeled results will preferably contain user-defined information, including: (i) wafer ID; (ii) test program; (iii) test version; (iv) tester ID; (v) insert date; (vi) update date; (vii) user ID; and (viii) user comments. Other types of labels may be useful for, e.g., drill-down analysis, such as process module., tool ID and chamber ID For each wafer, the collaborative learning template can display information for each wafer, including: (i) wafer ID; (ii) signature type (ASC or cluster, pulled from previous MRB template); (iii) signature name (from previous MRB template); (iv) test version; (v) tester ID; (vi) insert date; (vii) update date; (viii) user ID; and (ix) user comments.

In one embodiment, the interface can be configured to allow the user to quickly toggle key information from a pull-down menu or equivalent, rather than display all information directly in the primary window, such as the following items for each wafer: (i) lot ID; (ii) test program; and (iii) test version.

The user is generally allowed to manually enter comments for each wafer, and the interface can be configured with drilldown capability for each wafer, such as: (i) WEH, metrology, defect, indicator, PCM, etc.; and (ii) evidence for Nearest-Neighbor schemes—which neighbor wafers are similar. When the user is done interacting with the template, a button such as "apply changes" or similar widget can be selected to append or overwrite data (for example, based on the wafer ID) in the relabeled Results file and stored with the other wafer data in the database.

An instance of a collaborative learning (CL) template can be installed and configured with the following post setup functionality for use in production. For an incoming wafer(s) that is labelled as abnormal, the capability can include internally comparing the history and data of a new wafer with similar retrieved data of existing wafers. Comparison must be product flow specific, so the interface needs to include the ability to determine the correct associated data to retrieve based on a product ID. For example, the wafer should be labeled with the most likely test program and test version that are associated with same or similar bin pattern, or lack thereof.

Basic wafer information will of course be displayed, and preferably, a drill-down capability provided for the user to analyze the wafer's abnormal neighbors, including access to die maps, clusters, zone statistics, comments provided by other users, etc. The user should be allowed to override and update the dominant associated process module and process step, and save the updated results to be used for comparison for future wafer(s).

During the setup phase of CL template, the process engineer should be provided with the functionality: (i) to load an existing set of wafer data via the workflow; (ii) to identify boundary conditions/parameter cutoffs for this product flow, either automatically or manually; (iii) to review and check results for consistency (sanity check); and (iv) save wafer data and boundary conditions to be retrieved and read later.

Figure 4:
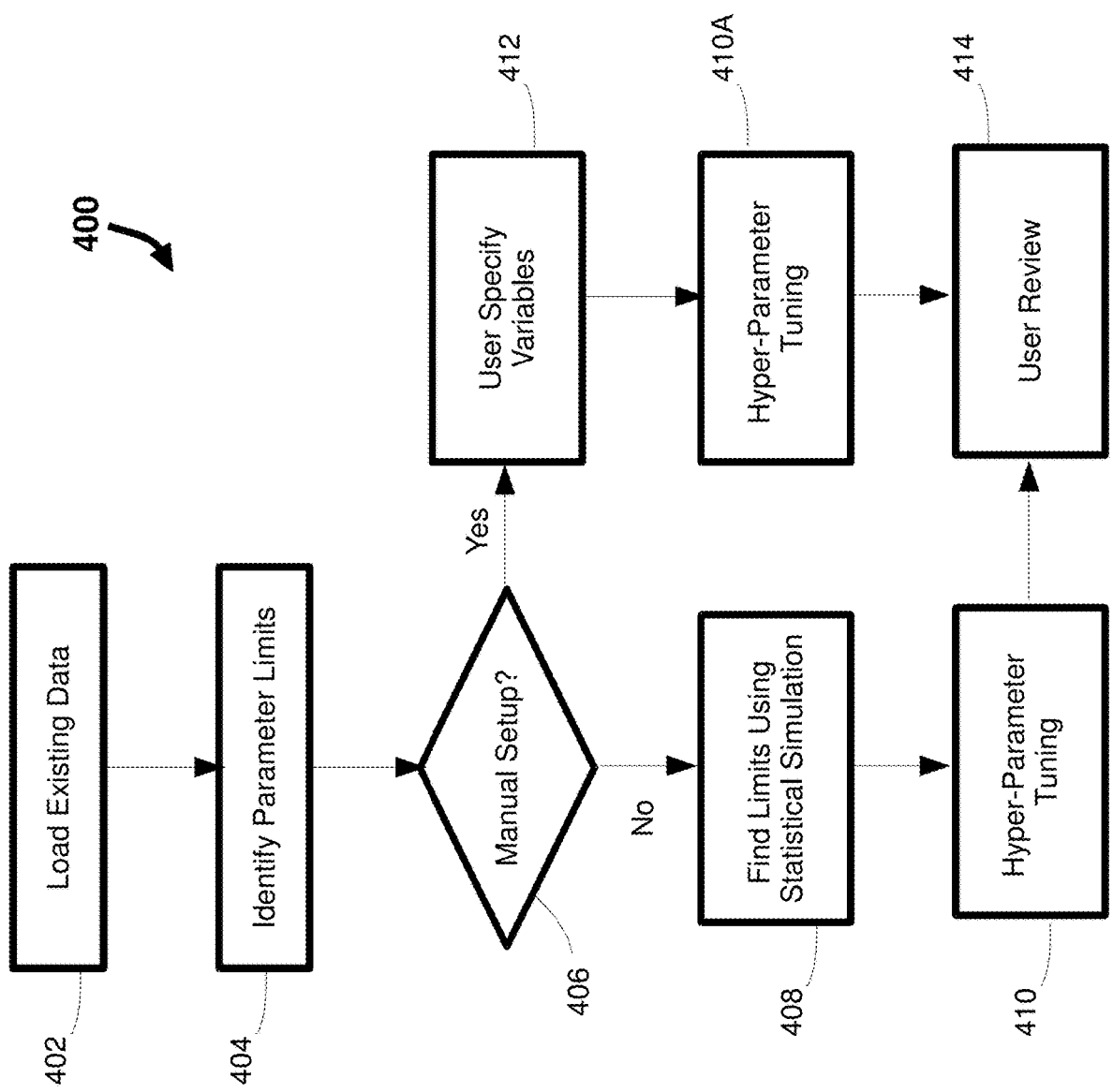
FIG. 4 is flow diagram illustrating one embodiment of a setup procedure for a CL model for wafer classification.

FIG. 4 is a simplified illustration of a workflow 400 of the setup specification, with the following more detailed description. In step 402, an existing or prior set of wafer data is loaded as inputs into the model, preferably through automated methods.

Inputs preferably include, for each wafer (with wafer ID): (i) bin data per die, and the $Die_x$ and $Die_y$ coordinates; (ii) ASC outputs, including zonal bin deltas from zonal medians for each bin type (numeric), and the general pattern label (categorical) and detail patterns (categorical); and (iii) clustering outputs, where the presence of each statistically significant cluster can be labeled with the following information: (a) central $Die_x$, $Die_y$ location of the cluster (numeric); (b) a bounding box of the cluster; and (c) all $Die_x$, $Die_y$ locations within the cluster. Other inputs can include the process history of each wafer from the wafer equipment history (WEH) including process module, tool ID, and chamber ID. If process is dynamic, load the history of processes and tools for a given wafer ID and product. If the process is static, i.e., having a dedicated process path, load the history of processes and tools for the product.

One specific input desirable for Collaborative Learning is clustering outputs. In step 404, parameter cutoffs for clustering are identified for this product flow, either automatically via a Monte Carlo routine or similar, or manually by user. For example, the following basic parameters are defined:

$d_c$=a fixed distance that is close enough to the selected wafer to consider it identical, with any difference attributed to random noise; $d_f$=a fixed distance that is considered far away enough to consider there is no similarity in the bin cluster and training set. Any overlap should be considered simply random chance.

k=the number of neighbors considered by the KNN algorithm; and

D=a metric used to calculate distance, possible including Euclidean, Minkowski, Mahalanobis, $L_1$, $L_\infty$ and similar solutions.

At step 406, there is an option for manual setup, although typically automatic setup is performed, beginning at step 408, where statistical simulations are run to find limits. $d_f$ and $d_c$ are functions of wafer map and defect density. An algorithm is typically used for clustering recognition, and it can be modified to estimate these additional parameters using Monte Carlo simulation with a varying amount of defects and fitting the response surface to the simulated results.

In step 410, hyper parameter tuning is performed to make sure that the results do not overfit the data. For example, n-fold cross validation can be used with the labels to identify best hyper parameter to fit to the selected model list in the dataset.

If manual setup is chosen in step 406, then an expert user, such as an experienced process engineer, can manually specify variables as needed in step 412, and hyper parameter tuning is performed in step 410A, just as in step 410.

Step 414 provides a method for the user to review and perform a sanity check on the results. As an example, user can review the distance metrics, $d_c$ and $d_f$, for different techniques, such as zonal KNN, or clustering KNN, or spatial KNN, as well as the distributions from Monte Carlo simulation. The user can also review all abnormal wafers, corrected labels, and recommended labels for each step.

Finally, in step 416, wafer data and boundary conditions can be saved to be retrieved and read later for predictions, including required parameters, combinations and KNN data. Thus, a model for collaborative learning can be used to resolve differences in wafer classification among different methodologies. Once resolved, the various rules-based and machine learning-based models can be updated and continuously retrained with the reclassification data to enhance the effectiveness of classification schemes.

The invention claimed is:

1. A computer-implemented method for classifying wafers in a semiconductor fabrication process, comprising:
   displaying on a graphical user interface ("GUI") first wafer identifying information for a plurality of wafers at a selected step of the semiconductor fabrication process;
   determining an initial classification for a first wafer of the plurality of wafers using a rule-based classification model on the basis of the wafer information obtained from the semiconductor fabrication process related to the first wafer;
   determining a predicted classification for the first wafer using a machine learning model trained to predict wafer classifications on the basis of input from rule-based classification model and user input;
   providing a graphical user interface ("GUI") displaying the wafer information including the initial classification and the predicted classification for the first wafer, the display also having a plurality of user interactive elements including a first user interactive element for selecting and updating the initial classification and/or the predicted classification and a second user interactive element for entering a user classification;
   receiving through the GUI the user input from the first user interactive element and/or the second user interactive element of the display to establish a final classification; and
   saving into storage for use in classifying a next wafer the initial classification, the predicted classification, the user classification, and the final classification for the first wafer.

2. The method of claim 1, further comprising:
   retrieving from storage the initial classification, the predicted classification, the user input, and the final classification for the first wafer; and
   training the machine learning model on the basis of the initial classification, the predicted classification, the user input, and the final classification for plurality of wafers.

3. The method of claim 1, the user input further comprising:
   receiving as the user input a confirmation of the initial classification or the predicted classification, or both.

4. The method of claim 1, the user input further comprising:
   receiving as the user input a modification of the initial classification or the predicted classification.

5. The method of claim 1, further comprising:
   providing a third user interactive element on the GUI enabling the user to drill down into a plurality of details of the first wafer information upon user selection of the first wafer via a third user interactive element.

6. A computer-implemented method for classifying wafers in a semiconductor fabrication process, comprising:
   displaying, within a graphical user interface ("GUI") on a computer monitor, a first window containing a plurality of wafer identification information each corresponding to respective ones of a plurality of wafers in a step of the semiconductor fabrication process;
   receiving a selection through the GUI of a first wafer of the plurality of wafers;
   determining a first classification for the first wafer using a first model, the first model is programmed with first instructions to implement a rule-based wafer classification method, the first model receiving as input first wafer information related to the first wafer obtained from the semiconductor fabrication process;
   displaying the first classification in the first window in association with wafer identification information corresponding to the first wafer;
   determining a second classification for the first wafer using a second model, the second model is a machine learning model trained to learn and predict wafer classifications on the basis of input from the first model and from the semiconductor fabrication process;
   displaying the second classification status in the first window in association with wafer identification information corresponding to the first wafer, separate and apart from the first classification;
   receiving user feedback through the GUI either confirming one or both of the first classification and the second classification or entering a different classification for the first wafer;
   receiving as input data the first classification, the second classification, the user feedback, and the first wafer information into a third model, the third model is a machine learning model trained to learn and predict wafer classifications on the basis of the input data; and
   periodically retraining the second model from the third model.

7. The method of claim 6, further comprising:
   displaying a second window within the GUI, the second window containing graphical information corresponding to the selected first wafer.

8. The method of claim 7, the graphical information comprising at least one wafer map corresponding to the selected first wafer.

9. The method of claim 6, further comprising:
providing a user interactive element on the GUI enabling the user to drill down into a plurality of details of the wafer information for the first wafer.

10. The method of claim 6, further comprising:
receiving user feedback through the GUI from a plurality of users;
resolving classification conflicts by providing additional information as input to the third model.

11. The method of claim 10, further comprising:
providing additional information including information regarding timing of feedback from different ones of the plurality of users.

12. The method of claim 10, further comprising:
providing additional information including information regarding timing status of each of the plurality of users.

13. The method of claim 6, further comprising:
receiving user feedback through the GUI from a plurality of users;
providing a user interactive element on the GUI enabling the user to run on demand the first model and/or the second model.

* * * * *